United States Patent
Zhou

(10) Patent No.: US 10,068,809 B2
(45) Date of Patent: Sep. 4, 2018

(54) TFT BACKPLANE MANUFACTURING METHOD AND TFT BACKPLANE

(71) Applicant: Shenzhen China Star Optoelectronics Technology Co., Ltd., Shenzhen (CN)

(72) Inventor: Xingyu Zhou, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 262 days.

(21) Appl. No.: 15/121,037

(22) PCT Filed: Jun. 22, 2016

(86) PCT No.: PCT/CN2016/086725
§ 371 (c)(1),
(2) Date: Aug. 24, 2016

(87) PCT Pub. No.: WO2017/210923
PCT Pub. Date: Dec. 14, 2017

(65) Prior Publication Data
US 2018/0226302 A1    Aug. 9, 2018

(30) Foreign Application Priority Data
Jun. 7, 2016 (CN) .......................... 2016 1 0399170

(51) Int. Cl.
*H01L 21/00* (2006.01)
*H01L 21/84* (2006.01)
(Continued)

(52) U.S. Cl.
CPC .......... *H01L 21/84* (2013.01); *H01L 27/1222* (2013.01); *H01L 27/1274* (2013.01);
(Continued)

(58) Field of Classification Search
CPC .. H01L 21/84; H01L 29/7869; H01L 27/3262
See application file for complete search history.

(56) References Cited

U.S. PATENT DOCUMENTS 8,569,122 B2 * 10/2013 Yuan .................... H01L 21/0274
257/E29.151
9,520,421 B1 * 12/2016 Li ........................ H01L 27/1281
(Continued)

*Primary Examiner* — Nicholas Tobergte
(74) *Attorney, Agent, or Firm* — Leong C. Lei

(57) ABSTRACT

The invention provides a manufacturing method for TFT backplane, through forming an oxygen-containing a-Si layer on the buffer layer and an oxygen-free a-Si layer on the oxygen-containing a-Si layer so that when using a boron induced SPC to crystallize the a-Si thin film, the contact interface between the a-Si thin film and the buffer layer is the oxygen-containing a-Si layer; because the nucleation is not easy to occur in oxygen-containing a-Si layer during high temperature crystallization, the nucleation only occurs top-down in the boron doped layer on the upper surface of the a-Si thin film for good die quality and thin film uniformity to achieve improve crystalline quality and uniformity. The TFT backplane provided by the invention is made with simple process, wherein the crystalline quality and uniformity of the polysilicon layer is preferable, and can enhance the TFT performance and the driving effect.

15 Claims, 6 Drawing Sheets

(51) Int. Cl.
    *H01L 27/12*     (2006.01)
    *H01L 29/786*    (2006.01)
    *H01L 27/32*     (2006.01)

(52) U.S. Cl.
    CPC .... *H01L 29/78651* (2013.01); *H01L 27/3262* (2013.01); *H01L 29/7869* (2013.01); *H01L 2251/50* (2013.01)

(56) References Cited

U.S. PATENT DOCUMENTS

| | | | |
|---|---|---|---|
| 9,711,540 B2 * | 7/2017 | Wang | H01L 27/1255 |
| 9,869,912 B2 * | 1/2018 | Xu | G02F 1/136209 |
| 9,935,137 B2 * | 4/2018 | He | H01L 27/1288 |
| 2010/0024872 A1 * | 2/2010 | Kishimoto | C23C 16/4408 |
| | | | 136/255 |
| 2016/0172387 A1 * | 6/2016 | Wang | H01L 27/1255 |
| | | | 257/71 |
| 2016/0365372 A1 * | 12/2016 | Li | H01L 27/1281 |
| 2017/0352711 A1 * | 12/2017 | Zhang | H01L 27/3246 |
| 2018/0069034 A1 * | 3/2018 | He | H01L 27/1288 |

* cited by examiner

TFT BACKPLANE MANUFACTURING METHOD AND TFT BACKPLANE

BACKGROUND OF THE INVENTION

1. Field of the Invention

The present invention relates to the field of display, and in particular to a thin film transistor (TFT) backplane manufacturing method, and a TFT backplane.

2. The Related Arts

The organic light emitting diode (OLED) display, also called organic electroluminescent display, is the new trend of flat panel display technology. Because the OLED display provides the advantages of simple manufacturing process, low cost, low power-consumption, high illumination, wide operating temperature range, thin size, short response time, enabling full-color large display, easy to match integrated circuit (IC) driver, and enabling flexible display, the OLED is recognized as the technology with widest application prospect.

The driving types of OLED can be divided according to the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

TFT is the major driver element for AMOLED display, and is directly related to the development trend of the high performance flat display. The TFT can be of various structures, and various materials can be used for active layer of the corresponding TFT structure. The low temperature poly silicon (LTPS) TFT is a preferred option. Because LTPS provides the advantages of the regular arrangement of atoms and high carrier mobility, LTPS TFT can better meet current requirements for the current-driven AMOLED organic electroluminescent display devices.

The method currently used for forming an LTPS thin film is boron ions (boron) induced solid phase crystallization (SPC) method, which is to implant Boron on the upper surface of the amorphous silicon (a-Si) thin film to induce nucleation and then to crystallize from top to bottom to form polysilicon (poly-Si) thin film. However, in the crystallization process, some nuclei are also randomly generated, usually in the lower surface of a-Si thin film, i.e., at the interface of a-Si thin film and the buffer, resulting in bottom-up crystallization. Generally, due to the stress, the bottom-up crystallization has more defects, and often stacked badly. Moreover, the random crystallization from below will affect the uniformity of the entire poly-Si thin film.

SUMMARY OF THE INVENTION

The object of the present invention is to provide a manufacturing method for TFT backplane, to inhibit the formation of nuclei at the lower surface, thereby to improve crystalline quality and uniformity.

Another object of the present invention is to provide a TFT backplane structure, with crystalline quality and uniformity of the polysilicon layer to improve the TFT performance and enhance the driving effect.

To achieve the above object, the present invention provides a manufacturing method for TFT backplane, which comprises: Step 1: providing a base substrate, and depositing a buffer layer on the base substrate; Step 2: forming an amorphous silicon (a-Si) thin film on the buffer layer, the a-Si thin-film comprising an oxygen-containing a-Si thin film on the buffer layer and an oxygen-free a-Si thin film on the oxygen-containing a-Si thin film; Step 3: performing boron doping on the a-Si thin film to form a boron-doped layer on an upper surface of the a-Si thin film, performing a rapid thermal annealing process on the a-Si thin film to crystallize the a-Si thin film into a low-temperature polysilicon (LTPS) thin film, the LTPS thin film comprising an oxygen-containing LTPS thin film on the buffer layer and an oxygen-free LTPS thin film on the oxygen-containing LTPS thin film; Step 4: removing the boron-doped layer on the LTPS upper surface, patternizing the LTPS thin film to obtain a first polysilicon (poly-Si) thin film and a second polysilicon thin film disposed with space in-between; Step 5: forming a gate insulating layer on the first polysilicon layer, the second polysilicon layer and the buffer layer, using a mask on both sides of the first polysilicon layer and the entire second polysilicon layer and then performing an N-type or P-type heavy doping to form a source contact area and a drain contact area at both sides of the first polysilicon layer, a channel area formed between the source contact area and the drain contact area, the second polysilicon layer becoming conductive after N-type or P-type heavy doping; Step 6: forming a gate on the gate insulating layer at the location corresponding to the above of first polysilicon layer, and forming a storage capacitor electrode on the gate insulating layer at the location corresponding to the above of second polysilicon layer; the storage capacitor electrode and the second polysilicon layer forming a storage capacitor; depositing an interlayer dielectric layer on the gate, storage capacitor electrode, and gate insulating layer, and forming a first via and a second via on the interlayer dielectric layer and the gate insulating layer respectively to correspond to the above of source contact area and the drain contact area; and Step 7: forming a source and a drain on the interlayer dielectric layer, and the source and the drain respectively contacting the source contact area and the drain contact area on the first polysilicon layer through the first via and the second via.

The oxygen-containing a-Si thin film has a thickness of one-tenth to one-twentieth of the a-Si thin film.

Step 2 comprises: Step 21: infusing a mixture of silane gas and oxygen above the buffer layer to obtain the oxygen-containing a-Si thin film deposited on the buffer layer; Step 22: infusing the silane gas above the buffer layer to obtain the oxygen-free a-Si thin film deposited on the buffer layer.

In Step 21, the flow rate of the silane gas maintains constant, while the flow rate of the oxygen is maximum at the beginning of Step 21 and then gradually decreases to zero at the end of Step 21.

In Step 21, the flow rate of the oxygen is less than or equal to the one-tenth of the silence gas; and in Steps 21, 22, the silane gas is one or more of the silane or disilane.

The manufacturing method for the TFT backplane further comprises: after Step 5, performing the rapid thermal annealing process on the entire substrate before Step 6, or after forming the gate and storage capacitor electrode, and before depositing the interlayer dielectric layer in Step 6, or after depositing the interlayer dielectric layer and before forming the first via and the second via in Step 6, to activate the N-type or P-type doped in the source contact area and the drain contact area of the first polysilicon layer and the entire second polysilicon layer in Step 5.

The manufacturing method for the TFT backplane further comprises Step 8: forming a planarization layer on the source, drain and interlayer dielectric layer, forming a third via on the on the planarization layer at location corresponding to the drain, forming a pixel electrode on the planarization layer, the pixel electrode contacting the drain through the third via; forming a pixel definition layer on the pixel electrode and the planarization layer, forming a fourth via on the pixel definition layer at location corresponding to the pixel electrode; and forming a plurality of spacers on the pixel definition layer disposed with gaps.

The present invention further provides a thin film transistor (TFT) backplane, which comprises: a base substrate, a buffer layer formed on the base substrate, a first polysilicon layer and a second polysilicon layer disposed on the buffer layer and spaced apart, a gate insulating layer disposed on the first polysilicon layer, the second polysilicon layer and the buffer layer, a gate disposed on the gate insulating layer and corresponding to the above of the first polysilicon layer, a storage capacitor electrode disposed on the gate insulating layer and corresponding to the above of the second polysilicon layer, an interlayer dielectric layer disposed on the gate, storage capacitor electrode, and gate insulating layer, a source and a drain disposed on the interlayer dielectric layer; wherein the first polysilicon layer comprising a source contact area and a drain contact area disposed respectively on both sides of the first polysilicon layer, and a channel area formed between the source contact area and the drain contact area; both the source contact area and the drain contact area being N-type heavily doped areas or P-type heavily doped areas; the interlayer dielectric layer and the gate insulating layer being disposed respectively with a first via and a second via corresponding to the above of the source contact area and the above of the drain contact area, the source and the drain contacting the source contact area and the drain contact area on the first polysilicon layer respectively through the first via and the second via; the entire second polysilicon layer being an N-type heavily doped area or a P-type heavily doped area, the second polysilicon layer and the storage capacitor electrode forming a storage capacitor; and both the first polysilicon layer and the second polysilicon layer comprising an oxygen-containing low temperature polysilicon (LTPS) thin film on the buffer layer and an oxygen-free LTPS thin film on the oxygen-containing LTPS thin film.

The oxygen-containing LTPS thin film has a thickness of one-tenth to one-twentieth of the first polysilicon layer and the second polysilicon layer.

The TFT backplane further comprises: a planarization layer disposed on the source, drain, and interlayer dielectric layer, a pixel electrode disposed on the planarization layer, a pixel definition layer disposed on the pixel electrode and the planarization layer, and a plurality of spacers disposed on the pixel definition layer and spaced apart; the planarization layer being disposed with a third via corresponding to the above of the drain, the pixel electrode contacting the drain through the third via; the pixel definition layer being disposed with a fourth via corresponding to the above of the pixel electrode.

The present invention also provides a manufacturing method for TFT backplane, which comprises: Step 1: providing a base substrate, and depositing a buffer layer on the base substrate; Step 2: forming an amorphous silicon (a-Si) thin film on the buffer layer, the a-Si thin-film comprising an oxygen-containing a-Si thin film on the buffer layer and an oxygen-free a-Si thin film on the oxygen-containing a-Si thin film; Step 3: performing boron doping on the a-Si thin film to form a boron-doped layer on an upper surface of the a-Si thin film, performing a rapid thermal annealing process on the a-Si thin film to crystallize the a-Si thin film into a low-temperature polysilicon (LTPS) thin film, the LTPS thin film comprising an oxygen-containing LTPS thin film on the buffer layer and an oxygen-free LTPS thin film on the oxygen-containing LTPS thin film; Step 4: removing the boron-doped layer on the LTPS upper surface, patternizing the LTPS thin film to obtain a first polysilicon (poly-Si) thin film and a second polysilicon thin film disposed with space in-between; Step 5: forming a gate insulating layer on the first polysilicon layer, the second polysilicon layer and the buffer layer, using a mask on both sides of the first polysilicon layer and the entire second polysilicon layer and then performing an N-type or P-type heavy doping to form a source contact area and a drain contact area at both sides of the first polysilicon layer, a channel area formed between the source contact area and the drain contact area, the second polysilicon layer becoming conductive after N-type or P-type heavy doping; Step 6: forming a gate on the gate insulating layer at the location corresponding to the above of first polysilicon layer, and forming a storage capacitor electrode on the gate insulating layer at the location corresponding to the above of second polysilicon layer; the storage capacitor electrode and the second polysilicon layer forming a storage capacitor; depositing an interlayer dielectric layer on the gate, storage capacitor electrode, and gate insulating layer, and forming a first via and a second via on the interlayer dielectric layer and the gate insulating layer respectively to correspond to the above of the source contact area and the drain contact area; and Step 7: forming a source and a drain on the interlayer dielectric layer, and the source and the drain respectively contacting the source contact area and the drain contact area on the first polysilicon layer through the first via and the second via; further comprising: after Step 5, performing the rapid thermal annealing process on the entire substrate before Step 6, or before depositing the interlayer dielectric layer in Step 6, or before forming the first via and the second via in Step 6, to activate the N-type or P-type doped in the source contact area and the drain contact area of the first polysilicon layer and the entire second polysilicon layer in Step 5; and further comprising Step 8: forming a planarization layer on the source, drain and interlayer dielectric layer, forming a third via on the on the planarization layer at location corresponding to the drain, forming a pixel electrode on the planarization layer, the pixel electrode contacting the drain through the third via; forming a pixel definition layer on the pixel electrode and the planarization layer, forming a fourth via on the pixel definition layer at location corresponding to the pixel electrode; and forming a plurality of spacers on the pixel definition layer disposed with gaps.

Compared to the known techniques, the present invention provides the following advantages: the present invention provides a manufacturing method for TFT backplane, through forming an oxygen-containing a-Si layer on the buffer layer and an oxygen-free a-Si layer on the oxygen-containing a-Si layer so that when using a boron induced SPC to crystallize the a-Si thin film, the contact interface between the a-Si thin film and the buffer layer is the oxygen-containing a-Si layer; because the nucleation is not easy to occur in oxygen-containing a-Si layer during high temperature crystallization, the nucleation only occurs top-down in the boron doped layer on the upper surface of the a-Si thin film for good die quality and thin film uniformity to achieve improve crystalline quality and uniformity. The present invention provides a TFT backplane, made with simple process, wherein the crystalline quality and uniformity of the polysilicon layer is preferable, and can enhance the TFT performance and the driving effect.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
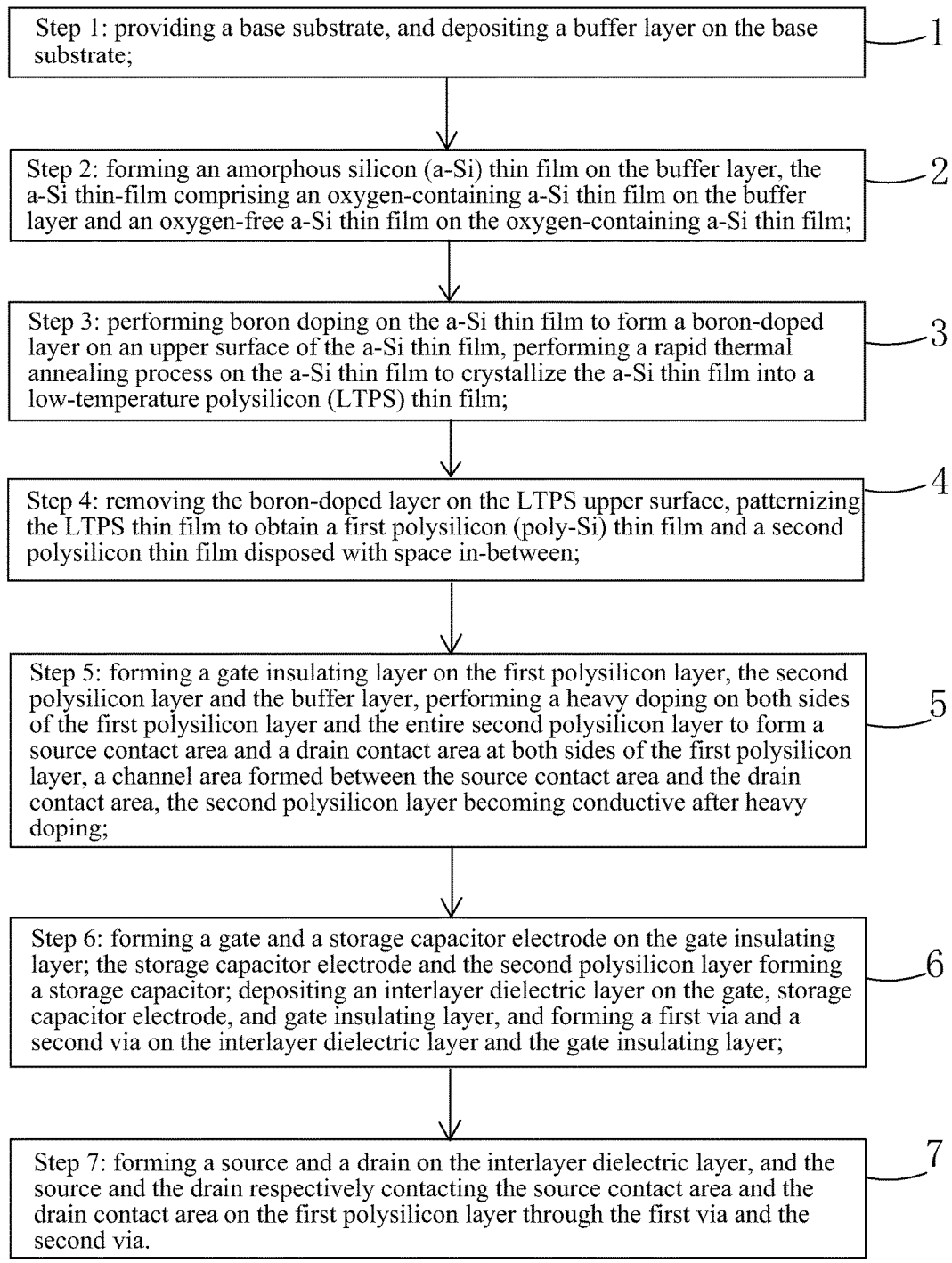
FIG. 1 is a schematic view showing the flowchart of a manufacturing method for TFT backplane provided by an embodiment of the present invention.
Figure 2:
FIG. 2 is a schematic view showing Step 1 of manufacturing method for TFT backplane provided by an embodiment of the present invention.

Refer to FIG. 1 for an embodiment of the manufacturing method for TFT backplane provided by the present invention, which comprises:

Step 1: as shown in FIG. 2, providing a base substrate 10, and depositing a buffer layer 20 on the base substrate 10.

Specifically, the base substrate 10 is a glass substrate.

Specifically, Step 1 further comprises: cleaning and baking the base substrate before depositing a buffer layer 20 on the base substrate 10.

Specifically, the buffer layer 20 comprises one or two of an SiNx layer or an SiOx layer. Specifically, the thickness of the SiNx or SiOx layer is 500-2000 Å, respectively.

Figure 3:
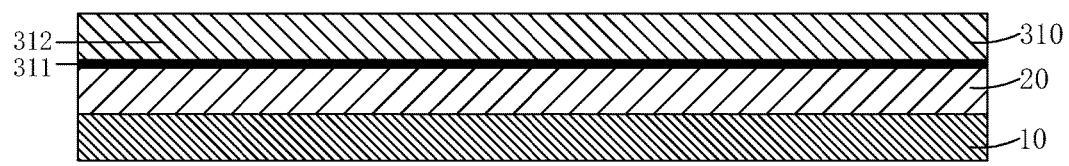
FIG. 3 is a schematic view showing Step 2 of manufacturing method for TFT backplane provided by an embodiment of the present invention.

Step 2: as shown in FIG. 3, forming an amorphous silicon (a-Si) thin film 310 on the buffer layer 20, the a-Si thin-film 310 comprising an oxygen-containing a-Si thin film 311 on the buffer layer 20 and an oxygen-free a-Si thin film 312 on the oxygen-containing a-Si thin film 311.

Specifically, the oxygen-containing a-Si thin film 311 has a thickness of one-tenth (1/10) to one-twentieth (1/20) of the a-Si thin film 310, and preferably, 1/10.

Specifically, Step 2 comprises:

Step 21: infusing a mixture of silane gas and oxygen above the buffer layer 20 to obtain the oxygen-containing a-Si thin film 311 deposited on the buffer layer 20.

Specifically, in Step 21, the flow rate of the silane gas maintains constant, while the flow rate of the oxygen is maximum at the beginning of Step 21 and then gradually decreases to zero at the end of Step 21.

Preferably, in Step 21, the flow rate of the oxygen is less than or equal to the one-tenth of the silence gas.

Step 22: infusing the silane gas above the buffer layer 20 to obtain the oxygen-free a-Si thin film 312 deposited on the buffer layer 20.

Specifically, in Steps 21, 22, the silane gas is one or more of the silane($SiH_4$) or disilane($Si_2H_6$).

Figure 4:
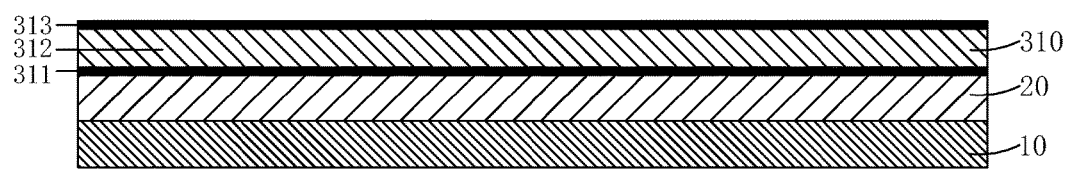
FIGS. 4-5 are schematic views showing Step 3 of manufacturing method for TFT backplane provided by an embodiment of the present invention.
Figure 5:
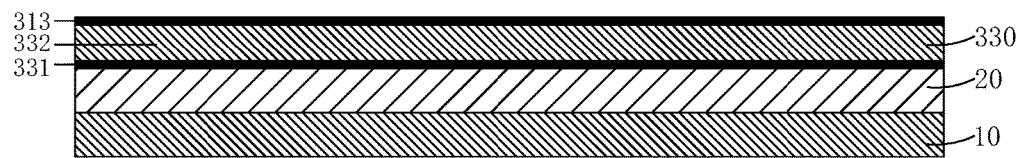
Figure 6:
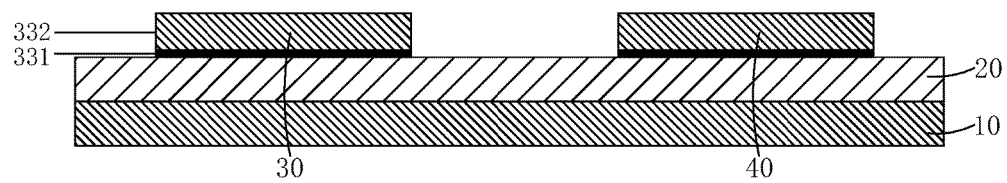
FIG. 6 is a schematic view showing Step 4 of manufacturing method for TFT backplane provided by an embodiment of the present invention.

Step 3: as shown in FIGS. 4-5, performing boron doping on the a-Si thin film 310 to form a boron-doped layer 313 on an upper surface of the a-Si thin film 310, performing a rapid thermal annealing process on the a-Si thin film 310 to crystallize the a-Si thin film 310 into a low-temperature polysilicon (LTPS) thin film 330, the LTPS thin film 330 comprising an oxygen-containing LTPS thin film 331 on the buffer layer 20 and an oxygen-free LTPS thin film 332 on the oxygen-containing LTPS thin film 331.

Specifically, in the crystallization process of Step 3, the contact interface between the a-Si thin film 310 and the buffer layer 20 is the oxygen-containing a-Si layer 311. Because the nucleation is not easy to occur in oxygen-containing a-Si layer 311 during high temperature crystallization, the nucleation occurs only from the top downwards in the boron doped layer 313 on the upper surface of the a-Si thin film 310. The top-down crystallization results in good die quality and thin film uniformity.

Specifically, in Step 3, the annealing temperature for the rapid thermal annealing process is 600° C.-730° C., with annealing holding time of 10 min-1 h.

Specifically, in Step 3, the ion concentration implanted in the boron doping process is $1\times10^{15}$-$1\times10^{16}$ ions/cm$^2$, with the ion energy of 5-20 keV.

Step 4: removing the boron-doped layer 313 on the LTPS 330 upper surface, patternizing the LTPS thin film 330 to obtain a first polysilicon (poly-Si) thin film 30 and a second polysilicon thin film 40 disposed with space in-between.

Specifically, the Step 4 of removing the boron-doped layer 313 on the LTPS 330 upper surface is: performing dry etching on the LPTS thin film 330.

Specifically, Step 4 further comprises: performing channel doping on the first polysilicon layer 30.

Specifically, the channel doping process is: performing P-type light doping on the entire first polysilicon layer 30, or performing P-type heavy doping on center area of the first polysilicon layer 30.

Specifically, the ions implanted in the P-type light doping process are boron ions (B+).

Specifically, in Step 4, the ion concentration implanted in the P-type light doping process is $1\times10^{12}$-$1\times10^{13}$ ions/cm$^2$, with the ion energy of 5-20 keV.

Figure 7:
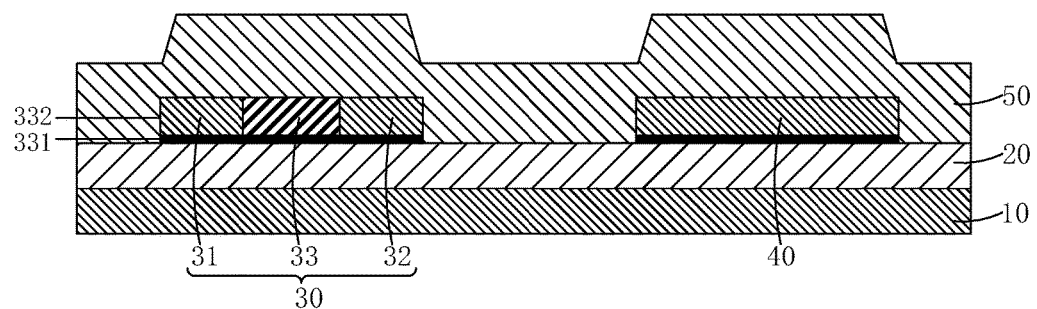
FIG. 7 is a schematic view showing Step 5 of manufacturing method for TFT backplane provided by an embodiment of the present invention.

Step 5: as shown in FIG. 7, forming a gate insulating layer 50 on the first polysilicon layer 30, the second polysilicon layer 40 and the buffer layer 20, using a mask on both sides of the first polysilicon layer 30 and the entire second polysilicon layer 40 and then performing an N-type or P-type heavy doping to form a source contact area 31 and a drain contact area 32 at both sides of the first polysilicon layer 30, a channel area 33 formed between the source contact area 31 and the drain contact area 32, the second polysilicon layer 40 becoming conductive after N-type or P-type heavy doping.

Specifically, ions implanted by the N-type heavy doping process are phosphorus ions (P+); and preferably, a phosphine (PH3) gas is used for P+ doping.

Specifically, ions implanted by the N-type heavy doping process are boron ions; and preferably, a diborane (of B2H6) gas is used for boron ions doping.

Specifically, the ion concentration implanted in the N-type heavy doping process is $1\times10^{15}$-$1\times10^{16}$ ions/cm$^2$, with the ion energy of 5-50 keV; the ion concentration implanted in the P-type heavy doping process is $1\times10^{15}$-$1\times10^{16}$ ions/cm$^2$, with the ion energy of 5-50 keV.

Figure 8:
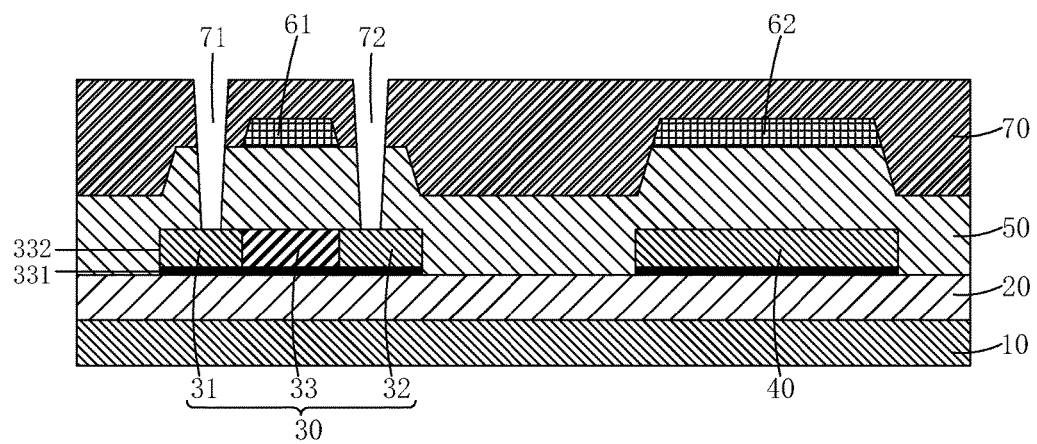
FIG. 8 is a schematic view showing Step 6 of manufacturing method for TFT backplane provided by an embodiment of the present invention.

Step 6: as shown in FIG. 8, forming a gate 61 on the gate insulating layer 50 at the location corresponding to the above of first polysilicon layer 30, and forming a storage capacitor electrode 62 on the gate insulating layer 50 at the location corresponding to the above of second polysilicon layer 40; the storage capacitor electrode 62 and the second polysilicon layer 40 forming a storage capacitor; depositing an interlayer dielectric layer 70 on the gate 61, storage capacitor electrode 62, and gate insulating layer 50, and forming a first via 71 and a second via 72 on the interlayer dielectric layer 70 and the gate insulating layer 50 respectively to correspond to the above of the source contact area 31 and the drain contact area 32.

Specifically, the formation of the gate 61 and the storage capacitor electrode 62 is: depositing a gate metal layer on the gate insulating layer 50, using a lithography process to pattern the metal layer to obtain the gate electrode 61 and the storage capacitor electrode 62.

Specifically, the gate insulating layer 50 comprises one or two of an SiNx layer or an SiOx layer. Specifically, the thickness of the SiNx or SiOx layer is 500-2000 Å, respectively.

Specifically, both the gate 61 and the storage capacitor electrode 62 comprise two molybdenum (Mo) layers and an aluminum (Al) layer sandwiched between the two Mo layers, or comprise a single Mo layer or a single Al layer. Specifically, the thickness of the gate 61 is 1500 Å-2000 Å.

Specifically, the interlayer dielectric layer 70 comprises one or two of an SiNx layer or an SiOx layer. Specifically, the thickness of the interlayer dielectric layer 70 is 2000-6000 Å, respectively.

Specifically, the manufacturing method for the TFT backplane further comprises: after Step 5, performing the rapid thermal annealing process on the entire substrate before Step 6, or before depositing the interlayer dielectric layer 70 in Step 6, or before forming the first via 71 and the second via 72 in Step 6, to activate the N-type or P-type doped in the source contact area 31 and the drain contact area 32 of the first polysilicon layer 30 and the entire second polysilicon layer 40 in Step 5 to improve effectiveness. Specifically, the annealing temperature for the rapid thermal annealing process is 450° C.-650° C., with annealing holding time of 1 min-1 h.

Figure 9:
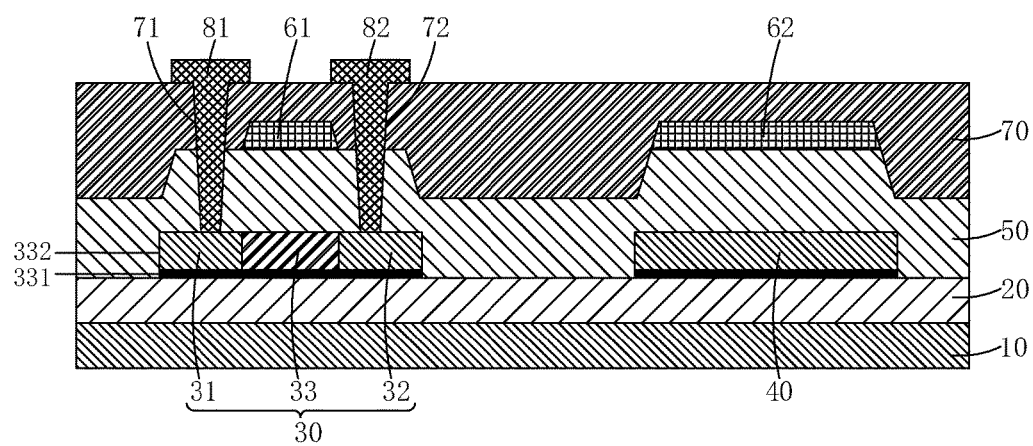
FIG. 9 is a schematic view showing Step 7 of manufacturing method for TFT backplane provided by an embodiment of the present invention.

Step 7: as shown in FIG. 9, forming a source 81 and a drain 82 on the interlayer dielectric layer 70, and the source 81 and the drain 82 respectively contacting the source contact area 31 and the drain contact area 32 on the first polysilicon layer 30 through the first via 71 and the second via 72.

Specifically, both the source 81 and the drain 82 comprise two molybdenum (Mo) layers and an aluminum (Al) layer sandwiched between the two Mo layers, or comprise a single Mo layer or a single Al layer. Specifically, the thickness of the source 81 and the drain 82 is 1500 Å-2000 Å.

Figure 10:
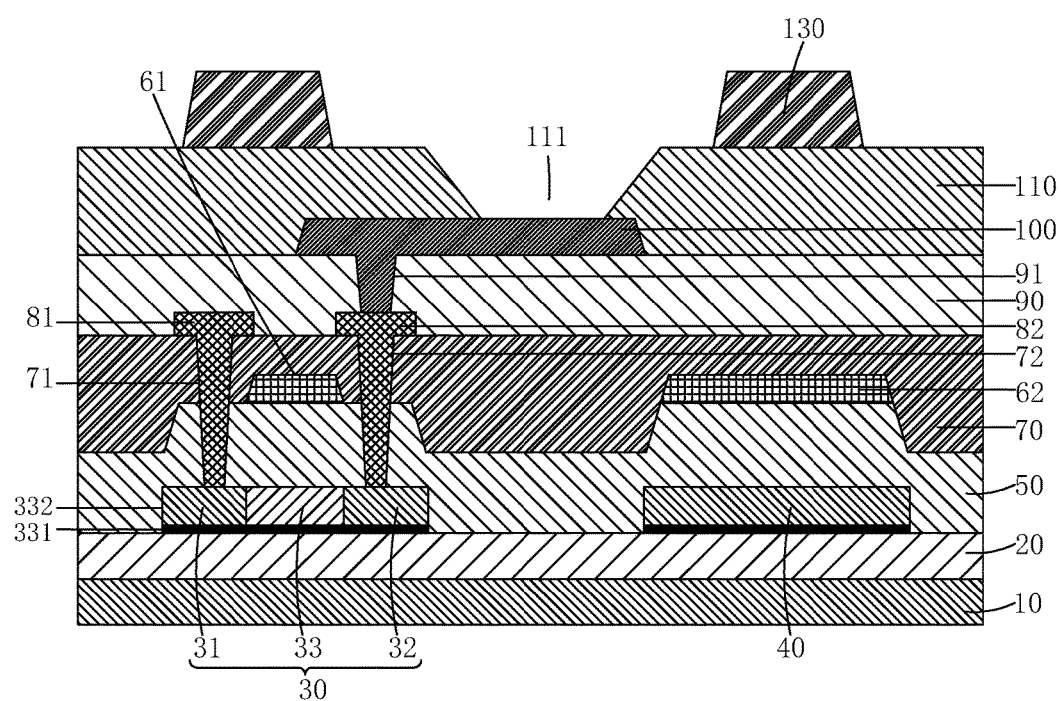
FIG. 10 is a schematic view showing Step 8 of manufacturing method for TFT backplane and the structure of TFT backplane provided by an embodiment of the present invention.

Step 8: as shown in FIG. 10, forming a planarization layer 90 on the source 81, drain 82 and interlayer dielectric layer 70, forming a third via 91 on the on the planarization layer 90 at location corresponding to the above of the drain 82, forming a pixel electrode 100 on the planarization layer 90, the pixel electrode 100 contacting the drain 82 through the third via 91; forming a pixel definition layer 110 on the pixel electrode 100 and the planarization layer 90, forming a fourth via 111 on the pixel definition layer at location corresponding to the above of the pixel electrode 100; and forming a plurality of spacers 130 on the pixel definition layer 110 disposed with gaps.

Specifically, the fourth via 111 is for forming an organic light-emitting layer of an OLED element, and the spacers 130 are used as cover plates for supporting the above after packaging.

Specifically, the spacers 30 are made of an organic material.

Specifically, the planarization layer 90 and the pixel definition layer 110 are made of an organic material.

Specifically, the pixel electrode is made of indium tin oxide (ITO).

The above manufacturing method for TFT backplane, through forming an a-Si thin film 310 comprising an oxygen-containing a-Si layer 311 on the buffer layer 20 and an oxygen-free a-Si layer 312 on the oxygen-containing a-Si layer 311, makes the contact interface between the a-Si thin film 310 and the buffer layer 20 become the oxygen-containing a-Si layer 311 when using a boron induced SPC to crystallize the a-Si thin film 310. Because the nucleation is not easy to occur in oxygen-containing a-Si layer 311 during high temperature crystallization, the nucleation only occurs top-down in the boron doped layer on the upper surface of the a-Si thin film 310 for good die quality and thin film uniformity to achieve improve crystalline quality and uniformity.

Refer to FIG. 10. Based on the above TFT back plane manufacturing method, the present invention further provides a thin film transistor (TFT) backplane, which comprises: a base substrate 10, a buffer layer 20 formed on the base substrate 10, a first polysilicon layer 30 and a second polysilicon layer 40 disposed on the buffer layer 20 and spaced apart, a gate insulating layer 50 disposed on the first polysilicon layer 30, the second polysilicon layer 40 and the buffer layer 20, a gate 61 disposed on the gate insulating layer 50 and corresponding to the above of the first polysilicon layer 30, a storage capacitor electrode 62 disposed on the gate insulating layer 50 and corresponding to the above of the second polysilicon layer 40, an interlayer dielectric layer 70 disposed on the gate 61, storage capacitor electrode 62, and gate insulating layer 50, a source 81 and a drain 82 disposed on the interlayer dielectric layer 70.

Wherein the first polysilicon layer 30 comprises a source contact area 31 and a drain contact area 32 disposed respectively on both sides of the first polysilicon layer 30, and a channel area 33 formed between the source contact area 31 and the drain contact area 32; both the source contact area 31 and the drain contact area 32 are N-type heavily doped areas or P-type heavily doped areas.

The interlayer dielectric layer 70 and the gate insulating layer 50 are disposed respectively with a first via 71 and a second via 72 corresponding to the above of the source contact area 31 and the above of the drain contact area 32. The source 81 and the drain 82 contact the source contact area 31 and the drain contact area 32 on the first polysilicon layer 30 respectively through the first via 71 and the second via 72.

The entire second polysilicon layer 40 is an N-type heavily doped area or a P-type heavily doped area, the second polysilicon layer 40 and the storage capacitor electrode 62 form a storage capacitor.

Both the first polysilicon layer 30 and the second polysilicon layer 40 comprises an oxygen-containing low temperature polysilicon (LTPS) thin film 331 on the buffer layer 20 and an oxygen-free LTPS thin film 332 on the oxygen-containing LTPS thin film 331.

Specifically, the TFT backplane further comprises: a planarization layer 90 disposed on the source 81, drain 82, and interlayer dielectric layer 70, a pixel electrode 100 disposed on the planarization layer 90, a pixel definition layer 110 disposed on the pixel electrode 100 and the planarization layer 90, and a plurality of spacers 130 disposed on the pixel definition layer 110 and spaced apart.

The planarization layer 90 is disposed with a third via 91 corresponding to the above of the drain 82, and the pixel electrode 100 contacts the drain 82 through the third via 91; the pixel definition layer 110 is disposed with a fourth via 111 corresponding to the above of the pixel electrode 110.

Specifically, the fourth via 111 is for forming an organic light-emitting layer of an OLED element.

Specifically, the spacers 30 are made of an organic material.

Specifically, the planarization layer 90 and the pixel definition layer 110 are made of an organic material.

Specifically, the pixel electrode is made of indium tin oxide (ITO).

The base substrate 10 is a glass substrate.

Specifically, the buffer layer 20 comprises one or two of an SiNx layer or an SiOx layer. Specifically, the thickness of the SiNx or SiOx layer is 500-2000 Å, respectively.

The oxygen-containing LTPS thin film 331 has a thickness of one-tenth (1/10) to one-twentieth (1/20) of the first polysilicon layer 30 and the second polysilicon layer 40, and preferably 1/10.

Specifically, the gate insulating layer 50 comprises one or two of an SiNx layer or an SiOx layer. Specifically, the thickness of the SiNx or SiOx layer is 500-2000 Å, respectively.

Specifically, both the gate 61 and the storage capacitor electrode 62 comprise two molybdenum (Mo) layers and an aluminum (Al) layer sandwiched between the two Mo layers, or comprise a single Mo layer or a single Al layer. Specifically, the thickness of the gate 61 is 1500 Å-2000 Å.

Specifically, ions implanted by the N-type heavy doping process are phosphorus ions (P+); and the ions implanted by the N-type heavy doping process are boron ions.

Preferably, the channel area 33 is a P-type lightly doped area, and the ions implanted in the P-type lightly doped are boron ions (B+).

Specifically, the ion concentration implanted in the N-type heavily doped area is $1\times10^{15}$-$1\times10^{16}$ ions/cm$^2$, with the ion energy of 5-50 keV; the ion concentration implanted in the P-type heavily doped area is $1\times10^{15}$-$1\times10^{16}$ ions/cm$^2$, with the ion energy of 5-50 keV; and the ion concentration implanted in the P-type lightly doped area is $1\times10^{12}$-$1\times10^{12}$ ions/cm$^2$.

Specifically, the interlayer dielectric layer 70 comprises one or two of an SiNx layer or an SiOx layer. Specifically, the thickness of the interlayer dielectric layer 70 is 2000-6000 Å, respectively.

Specifically, both the source 81 and the drain 82 comprise two molybdenum (Mo) layers and an aluminum (Al) layer sandwiched between the two Mo layers, or comprise a single Mo layer or a single Al layer. Specifically, the thickness of the source 81 and the drain 82 is 1500 Å-2000 Å.

Specifically, in the TFT backplane of the present invention, the gate 61, source 81, drain 82, and the first polysilicon layer 30 form a driving TFT, for driving the organic light-emitting layer of an OLED element.

The above TFT backplane is made with a simple process, wherein the crystalline quality and uniformity of the polysilicon layer is preferable, and can enhance the TFT performance and the driving effect.

In summary, the present invention provides a TFT backplane manufacturing method and a TFT backplane. The present invention provides a manufacturing method for TFT backplane, through forming an oxygen-containing a-Si layer on the buffer layer and an oxygen-free a-Si layer on the oxygen-containing a-Si layer so that when using a boron induced SPC to crystallize the a-Si thin film, the contact interface between the a-Si thin film and the buffer layer is the oxygen-containing a-Si layer; because the nucleation is not easy to occur in oxygen-containing a-Si layer during high temperature crystallization, the nucleation only occurs top-down in the boron doped layer on the upper surface of the a-Si thin film for good die quality and thin film uniformity to achieve improve crystalline quality and uniformity. The present invention provides a TFT backplane, made with simple process, wherein the crystalline quality and uniformity of the polysilicon layer is preferable, and can enhance the TFT performance and the driving effect.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for TFT backplane, which comprises:

Step 1: providing a base substrate, and depositing a buffer layer on the base substrate;

Step 2: forming an amorphous silicon (a-Si) thin film on the buffer layer, the a-Si thin-film comprising an oxygen-containing a-Si thin film on the buffer layer and an oxygen-free a-Si thin film on the oxygen-containing a-Si thin film;

Step 3: performing boron doping on the a-Si thin film to form a boron-doped layer on an upper surface of the a-Si thin film, performing a rapid thermal annealing process on the a-Si thin film to crystallize the a-Si thin film into a low-temperature polysilicon (LTPS) thin film, the LTPS thin film comprising an oxygen-containing LTPS thin film on the buffer layer and an oxygen-free LTPS thin film on the oxygen-containing LTPS thin film;

Step 4: removing the boron-doped layer on the LTPS upper surface, patternizing the LTPS thin film to obtain a first polysilicon (poly-Si) thin film and a second polysilicon thin film disposed with space in-between;

Step 5: forming a gate insulating layer on the first polysilicon layer, the second polysilicon layer and the buffer layer, using a mask on both sides of the first polysilicon layer and the entire second polysilicon layer and then performing an N-type or P-type heavy doping to form a source contact area and a drain contact area at both sides of the first polysilicon layer, a channel area formed between the source contact area and the drain contact area, the second polysilicon layer becoming conductive after N-type or P-type heavy doping;

Step 6: forming a gate on the gate insulating layer at the location corresponding to the above of first polysilicon layer, and forming a storage capacitor electrode on the gate insulating layer at the location corresponding to the above of second polysilicon layer; the storage capacitor electrode and the second polysilicon layer forming a storage capacitor; depositing an interlayer dielectric layer on the gate, storage capacitor electrode, and gate insulating layer, and forming a first via and a second via on the interlayer dielectric layer and the gate insulating layer respectively to correspond to the above of source contact area and the drain contact area; and Step 7: forming a source and a drain on the interlayer dielectric layer, and the source and the drain respectively contacting the source contact area and the drain contact area on the first polysilicon layer through the first via and the second via.

2. The manufacturing method for TFT backplane as claimed in claim 1, wherein the oxygen-containing a-Si thin film has a thickness of one-tenth to one-twentieth of the a-Si thin film.

3. The manufacturing method for TFT backplane as claimed in claim 1, wherein Step 2 comprises:

Step 21: infusing a mixture of silane gas and oxygen above the buffer layer to obtain the oxygen-containing a-Si thin film deposited on the buffer layer;

Step 22: infusing the silane gas above the buffer layer to obtain the oxygen-free a-Si thin film deposited on the buffer layer.

4. The manufacturing method for TFT backplane as claimed in claim 3, wherein in Step 21, the flow rate of the silane gas maintains constant, while the flow rate of the oxygen is maximum at the beginning of Step 21 and then gradually decreases to zero at the end of Step 21.

5. The manufacturing method for TFT backplane as claimed in claim 3, wherein in Step 21, the flow rate of the oxygen is less than or equal to the one-tenth of the silence gas; and in Steps 21, 22, the silane gas is one or more of the silane or disilane.

6. The manufacturing method for TFT backplane as claimed in claim 1, further comprises: after Step 5, performing the rapid thermal annealing process on the entire substrate before Step 6, or after forming the gate and storage capacitor electrode, and before depositing the interlayer dielectric layer in Step 6, or after depositing the interlayer dielectric layer and before forming the first via and the second via in Step 6, to activate the N-type or P-type doped in the source contact area and the drain contact area of the first polysilicon layer and the entire second polysilicon layer in Step 5.

7. The manufacturing method for TFT backplane as claimed in claim 1, further comprises Step 8: forming a planarization layer on the source, drain and interlayer dielectric layer, forming a third via on the on the planarization layer at location corresponding to the drain, forming a pixel electrode on the planarization layer, the pixel electrode contacting the drain through the third via;

forming a pixel definition layer on the pixel electrode and the planarization layer, forming a fourth via on the pixel definition layer at location corresponding to the pixel electrode; and forming a plurality of spacers on the pixel definition layer disposed with gaps.

8. A thin film transistor (TFT) backplane, which comprises: a base substrate, a buffer layer formed on the base substrate, a first polysilicon layer and a second polysilicon layer disposed on the buffer layer and spaced apart, a gate insulating layer disposed on the first polysilicon layer, the second polysilicon layer and the buffer layer, a gate disposed on the gate insulating layer and corresponding to the above of the first polysilicon layer, a storage capacitor electrode disposed on the gate insulating layer and corresponding to the above of the second polysilicon layer, an interlayer dielectric layer disposed on the gate, storage capacitor electrode, and gate insulating layer, a source and a drain disposed on the interlayer dielectric layer;

wherein the first polysilicon layer comprising a source contact area and a drain contact area disposed respectively on both sides of the first polysilicon layer, and a channel area formed between the source contact area and the drain contact area; both the source contact area and the drain contact area being N-type heavily doped areas or P-type heavily doped areas;

the interlayer dielectric layer and the gate insulating layer being disposed respectively with a first via and a second via corresponding to the above of the source contact area and the above of the drain contact area, the source and the drain contacting the source contact area and the drain contact area on the first polysilicon layer respectively through the first via and the second via;

the entire second polysilicon layer being an N-type heavily doped area or a P-type heavily doped area, the second polysilicon layer and the storage capacitor electrode forming a storage capacitor; and both the first polysilicon layer and the second polysilicon layer comprising an oxygen-containing low temperature polysilicon (LTPS) thin film on the buffer layer and an oxygen-free LTPS thin film on the oxygen-containing LTPS thin film.

9. The TFT backplane as claimed in claim 8, wherein the oxygen-containing LTPS thin film has a thickness of one-tenth to one-twentieth of the first polysilicon layer and the second polysilicon layer.

10. The TFT backplane as claimed in claim 8, further comprises: a planarization layer disposed on the source, drain, and interlayer dielectric layer, a pixel electrode disposed on the planarization layer, a pixel definition layer disposed on the pixel electrode and the planarization layer, and a plurality of spacers disposed on the pixel definition layer and spaced apart;

the planarization layer being disposed with a third via corresponding to the above of the drain, the pixel electrode contacting the drain through the third via; the pixel definition layer being disposed with a fourth via corresponding to the above of the pixel electrode.

11. A manufacturing method for TFT backplane, which comprises:

Step 1: providing a base substrate, and depositing a buffer layer on the base substrate;

Step 2: forming an amorphous silicon (a-Si) thin film on the buffer layer, the a-Si thin-film comprising an oxygen-containing a-Si thin film on the buffer layer and an oxygen-free a-Si thin film on the oxygen-containing a-Si thin film;

Step 3: performing boron doping on the a-Si thin film to form a boron-doped layer on an upper surface of the a-Si thin film, performing a rapid thermal annealing process on the a-Si thin film to crystallize the a-Si thin film into a low-temperature polysilicon (LTPS) thin film, the LTPS thin film comprising an oxygen-containing LTPS thin film on the buffer layer and an oxygen-free LTPS thin film on the oxygen-containing LTPS thin film;

Step 4: removing the boron-doped layer on the LTPS upper surface, patternizing the LTPS thin film to obtain a first polysilicon (poly-Si) thin film and a second polysilicon thin film disposed with space in-between;

Step 5: forming a gate insulating layer on the first polysilicon layer, the second polysilicon layer and the buffer layer, using a mask on both sides of the first polysilicon layer and the entire second polysilicon layer and then performing an N-type or P-type heavy doping to form a source contact area and a drain contact area at both sides of the first polysilicon layer, a channel area formed between the source contact area and the drain contact area, the second polysilicon layer becoming conductive after N-type or P-type heavy doping;

Step 6: forming a gate on the gate insulating layer at the location corresponding to the above of first polysilicon layer, and forming a storage capacitor electrode on the gate insulating layer at the location corresponding to the above of second polysilicon layer; the storage capacitor electrode and the second polysilicon layer forming a storage capacitor; depositing an interlayer dielectric layer on the gate, storage capacitor electrode, and gate insulating layer, and forming a first via and a second via on the interlayer dielectric layer and the gate insulating layer respectively to correspond to the above of source contact area and the drain contact area; and Step 7: forming a source and a drain on the interlayer dielectric layer, and the source and the drain respectively contacting the source contact area and the drain contact area on the first polysilicon layer through the first via and the second via;

further comprises: after Step 5, performing the rapid thermal annealing process on the entire substrate before Step 6, or after forming the gate and storage capacitor electrode, and before depositing the interlayer dielectric layer in Step 6, or after depositing the interlayer dielectric layer and before forming the first via and the second via in Step 6, to activate the N-type or P-type doped in the source contact area and the drain contact area of the first polysilicon layer and the entire second polysilicon layer in Step 5;

further comprises Step 8: forming a planarization layer on the source, drain and interlayer dielectric layer, forming a third via on the on the planarization layer at location corresponding to the drain, forming a pixel electrode on the planarization layer, the pixel electrode contacting the drain through the third via;

forming a pixel definition layer on the pixel electrode and the planarization layer, forming a fourth via on the pixel definition layer at location corresponding to the pixel electrode; and forming a plurality of spacers on the pixel definition layer disposed with gaps.

12. The manufacturing method for TFT backplane as claimed in claim 11, wherein the oxygen-containing a-Si thin film has a thickness of one-tenth to one-twentieth of the a-Si thin film.

13. The manufacturing method for TFT backplane as claimed in claim 11, wherein Step 2 comprises:
    Step 21: infusing a mixture of silane gas and oxygen above the buffer layer to obtain the oxygen-containing a-Si thin film deposited on the buffer layer;
    Step 22: infusing the silane gas above the buffer layer to obtain the oxygen-free a-Si thin film deposited on the buffer layer.

14. The manufacturing method for TFT backplane as claimed in claim 13, wherein in Step 21, the flow rate of the silane gas maintains constant, while the flow rate of the oxygen is maximum at the beginning of Step 21 and then gradually decreases to zero at the end of Step 21.

15. The manufacturing method for TFT backplane as claimed in claim 13, wherein in Step 21, the flow rate of the oxygen is less than or equal to the one-tenth of the silence gas; and in Steps 21, 22, the silane gas is one or more of the silane or disilane.

* * * * *